United States Patent [19]

Rhodes et al.

[11] Patent Number: 5,084,406
[45] Date of Patent: Jan. 28, 1992

[54] METHOD FOR FORMING LOW RESISTANCE DRAM DIGIT-LINE

[75] Inventors: Howard E. Rhodes; Pierre C. Fazan; Hiang C. Chan; Charles H. Dennison; Yauh-Ching Liu, all of Boise, Id.

[73] Assignee: Micron Technology, Inc., Boise, Id.

[21] Appl. No.: 724,026

[22] Filed: Jul. 1, 1991

[51] Int. Cl.⁵ .............................................. H01L 21/70
[52] U.S. Cl. ........................................ 437/52; 437/48; 437/200; 437/228
[58] Field of Search .................. 437/43, 47, 48, 52, 437/60, 191, 195, 200, 228, 233, 235, 919; 357/23.6, 51

[56] References Cited

U.S. PATENT DOCUMENTS

4,953,126  8/1990  Ema ................................... 357/23.6
4,970,564 11/1990  Kimura et al. ..................... 357/23.6

FOREIGN PATENT DOCUMENTS

0286270 12/1987 Japan .

OTHER PUBLICATIONS

Kimura et al., "A New Stacked Capacitor DRAM Cell Characterized by a Storage Capacitor on a Bit-Line Structure", IEDM Digest, 1988, pp. 596–599.
Toru Kaga et al., "Crown Shaped Stacked Capacitor Cell for 1.5 V Operation 64-Mb DRAMS", IEEE Trans. on Electron Dev., vol. 38, No. 2–Feb. 1991, pp. 225–226.
S. Inoue et al., "A Stacked Capacitor (SSC) Cell for 64 mBit DRAMS", IEDM Digest, Dec. 89, pp. 31–34.
T. Kisu et al., "A Novel Storage Capacitance Enlargement Structure Using a Double Stacked Storage Node in STC DRAM Cell", Conf. on Solid State Materials and Dev., 1988, pp. 581–584.
Y. Kawamoto et al., "A 1.28 $\mu m^2$ Bit-Line Shielded Memory Cell Technology for 64 mb DRAMS", Symposium on VLSI Technology, 1991, pp. 13–14.
T. Ema et al., "3-Dimensional Stacked Capacitor Cell for 16m and 64M Drams", IEDM Digest, 1988, pp. 592–595.
Hideo Watanabe et al., "Stacked Capacitor Cells for High-Density Dynamic RAM", IEDM Digest, 1988, pp. 600–603.

*Primary Examiner*—Brian E. Hearn
*Assistant Examiner*—Tom Thomas
*Attorney, Agent, or Firm*—Albert M. Crowder, Jr.

[57] ABSTRACT

A DRAM fabrication process is disclosed for constructing a reduced resistance digit-line. The digit-line is so constructed as to maintain low resistance as it crosses the gaps between word-lines. By bridging gaps having a dimension less than or falling below a calculated critical gap spacing, and following the contours of gaps having a dimension greater or falling above that critical gap dimension, the digit-line resistance can be minimized.

24 Claims, 7 Drawing Sheets

METHOD FOR FORMING LOW RESISTANCE DRAM DIGIT-LINE

FIELD OF THE INVENTION

This invention relates to semiconductor circuit memory storage devices and more particularly to a process for fabricating reduced resistance digit-lines in high density dynamic random access memory (DRAM) arrays.

BACKGROUND OF THE INVENTION

The circuit density of dynamic semiconductor memory storage devices continues to increase at a fairly constant rate. One method of providing such increase in capacity is the advent of the stacked capacitor dynamic access memory (DRAM). To most efficiently utilize this increase in memory capacity, that a stacked capacitor DRAM provides, requires decreasing the access time. However, a major problem with the stacked DRAMs is caused by stack height. As the stack height increases, the digit-line which is placed perpendicular to the word-line and so goes over the word-line topography increases in length, with an attendant increase in its resistance. As DRAM digit-line resistance is a critical parameter that determines the speed performance of the device, various methods are being tried in order to reduce such resistance.

A paper submitted by Y. Kawamoto et al., entitled "A 1.28$\mu m^2$ Bit-Line Shielded Memory Cell Technology for 64Mb DRAMs", Symposium on VLSI Technology, p. 13, 1990, herein incorporated by reference, discusses a method of fabricating a stacked DRAM having a reduced resistance bit-line.

The planarized bit-line (so referred to in the article) process requires a thick Polysilicon film deposited on the surface to fill the spacing between the word-lines. When the planarization is carried out using an insulator such as SiOz, it is impossible to open the bit-line contact-hole self- aligned to the word-line. Accordingly, the Polysilicon is adapted to planarize the word-line steps.

Next, $WSi_x$ film is deposited over the planarized Polysilicon surface after the Polysilicon is etched back to a remaining thickness of less than 100 nm above the word-line. This planarized bit-line produces a DRAM with low-power dissipation.

The Polycide bit-line used in this process consists of the $WSi_x$ and Polysilicon double layers instead of other low-resistance materials because high temperature treatment is necessary to fabricate the storage capacitor after bit-line wiring. Accordingly, this "BRIDGE ALL" method while resulting in a lower bit-line resistance adds additional process complexity to the manufacture of the stacked capacitor DRAM.

Additional use of the planarized or BRIDGE ALL method of producing a bit-line is shown in a paper submitted by T. Kaga et al., entitled "Crown-Shaped Stacked-Capacitor Cell for 1.5-V Operation 64-Mb DRAMs", IEEE Transactions On Electron Devices, volume 38, number 2, Feb. 1991, pages 255-260. In this paper, and referring in particular to FIG. 8, on page 258, the Bridge All method, is again described and compared with a conventional nonplanarized bit-line. Again, use of the Bridge All method increases manufacturing process complexity. For instance, if the word-line gaps are chosen small so that the digit-line Polysilicon deposition (Poly2) bridges them all, a small word-line gap at buried contact 2 (BC2) implies a small BC2 contact region. This makes the BC2 contact process less production-worthy. If, however, the bridging is alternatively achieved by depositing very thick Poly2, the Poly2 etch-back becomes a critical step, increasing the manufacturing complexity of the device.

Another method, the "GAP ALL" method has been proposed wherein the digit-line is deposited so as to follow the contours of all gaps between word-lines. In both the GAP ALL method and the above-mentioned BRIDGE ALL method, we have discovered that there is a critical gap between word-lines where the digit-line resistance rises abruptly as the digit-line follows the contours or gap between the word-lines. At the critical gap spacing, the resistance of the digit-line rises an order of magnitude or greater. Factors in determining the critical gap include the Poly thickness and the word-line Spacer thickness.

The present invention produces a reduced resistance digit-line by utilizing a bridging method where the gap between word-lines is less than the above-described critical gap and uses a gaping method where the distance between word-lines is larger or greater than the critical gap.

SUMMARY OF THE INVENTION

This invention is directed to reducing digit-line resistance in a high density/high volume DRAM (Dynamic Random Access Memory) fabrication process An existing stack capacitor fabrication process is modified to provide a BRIDGE-GAP method of forming the digit-line across the word-line and word-line gaps of the device. Although the present invention is directed to be used in a DRAM process, it will be evident to those skilled in the art to incorporate these steps into other processes requiring memory cells such as SRAMs, VRAMs or the like.

After a silicon wafer is prepared using conventional process steps up to and including formation of the word-lines, word-line Spacer, and self-aligned buried contact formation, a second layer of Polysilicon is deposited, with a thickness chosen so that the gap at buried contact 1 (BC1 contact) and the gap (BC1' gap) between adjacent BC1's are bridged but the gap (BC2 gap) between adjacent buried contact 2's (BC2's) is not bridged but rather gapped, that is, the Poly follows the contours of the gap spacing between the word-lines at the BC2 gap.

DETAILED DESCRIPTION OF THE PREFERRED EMBODIMENT

The present invention is directed to reducing digit-line resistance in a high density/high volume DRAM fabrication process by forming low resistance Polycide digit-lines to decrease access time to the device. The polycide is generally composed of Poly2 and a refractory silicide such as $WSi_x$, $MoSi_x$, $TaSi_x$ and $TiSi_x$ or the like, or of a refractory metal such as W, Mo, Ta, and Ti or the like.

The major problem with the use of stacked DRAMs is that as the stack height increases, the path the digit-line traces across the topography of the word-lines also increases, causing a corresponding increase in resistance. In the case of DRAMs and the like, the digit-line resistance is a critical parameter that determines the speed performance of the device. Again, the digit-line is perpendicular to the word-line and so follows the contours of the word-line topography. It has been discovered that, and referring now to FIG. 1, the resistance of the digit-line is a function of the gap width dimension between the word-lines across which the digit-line travels and the thickness of the Poly used to form the digit-line as indicated in Eq. (1) below. Implementation of the discovery has led to conception of a single process/design to achieve low digit-line resistance. From FIG. 1, the critical gap includes the region defined by the following equation:

$$2 \times Spacer1\ thickness + 2 \times Poly2\ thickness \leq critical\ gap \leq 2 \times Spacer1\ thickness + 2 \times Poly2\ thickness + 0.4\mu \quad (1)$$

By Spacer1 thickness is meant the Spacer1 thickness adjacent to Poly1 lines measured at the bottom of the Poly1 line prior to Poly2 deposition. Eq. (1) will vary slightly depending on the height of the word-line stack and the refractory silicide uniformity.

Figure 1:
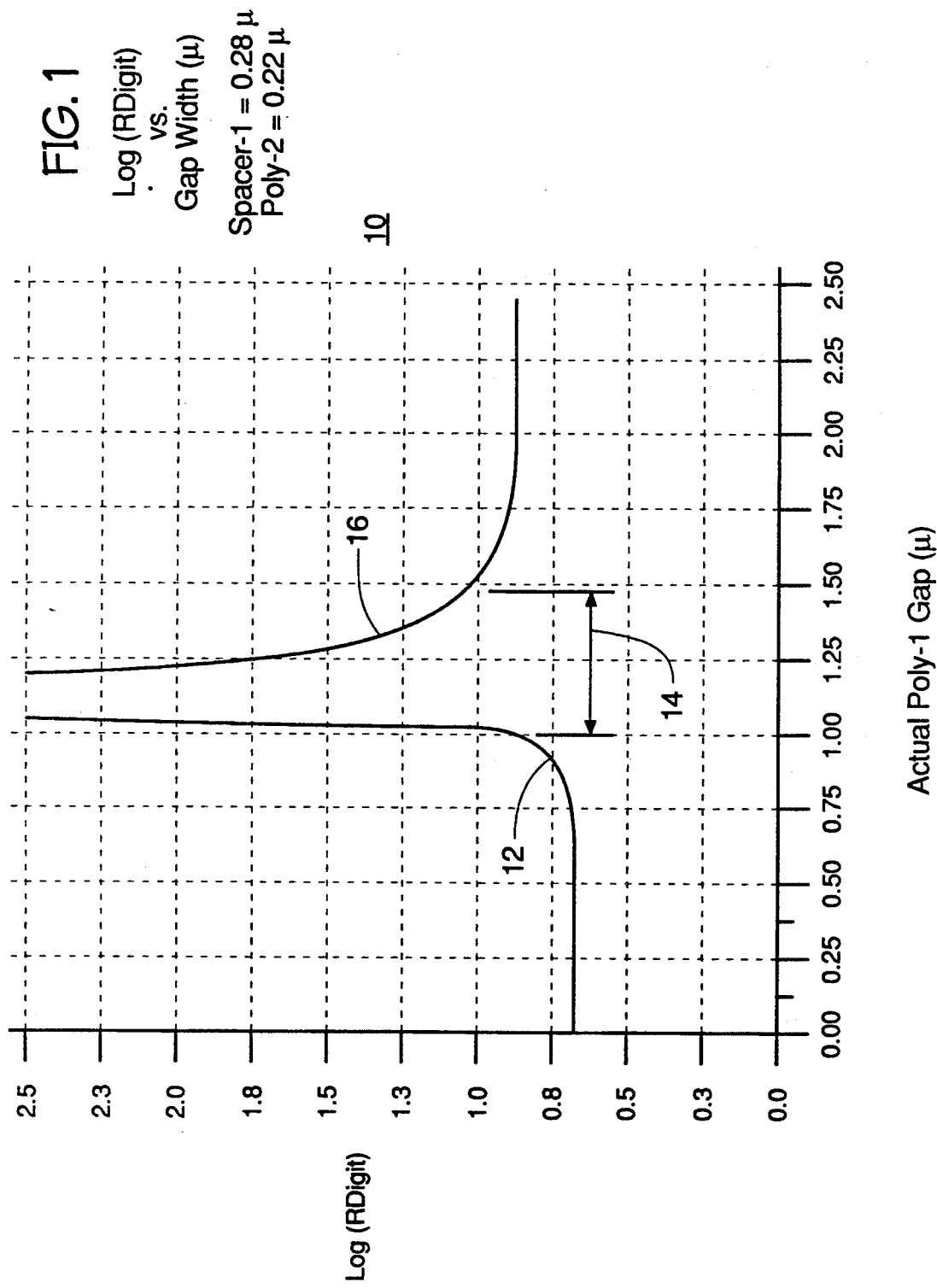
FIG. 1 is a graph of the log of digit-line resistance versus the word-line gap width showing the increase in digit-line resistance across the critical gap spacing.

Still referring to FIG. 1, there shown a graph 10 of the log of digit-line resistance (Rdigit) versus the drawn gap width or dimension in microns between adjacent word-lines. As shown, the plot of log (Rdigit) versus gap width ($\mu$) shown as line 12 has a relatively low resistance plot until the gap width reaches the lower limit of the critical gap 14 as indicated on graph 10. At this point, it can be seen that Rdigit rapidly increases by at least 1.5 orders in magnitude. Further, it may be seen that as the gap width continues to increase the plot of Rdigit against a gap width which is greater than the upper limit of the critical gap width 14, again becomes relatively small as shown by line 16. However, as the gap width shown as line 16 and which the digit-line follows is greater than that shown as line 12, Rdigit will have a minimum resistance above the critical gap width which is larger than the minimum resistance of Rdigit where the gap width is less than the critical gap width.

The horizontal axis in FIG. 1 refers to the actual gap between adjacent Poly1 word-lines measured in microns. The graph in FIG. 1 is shown for the case where Spacer1 thickness=$0.28\mu$ and Poly2 thickness $0.22\mu$. If different Spacer1 and/or Poly2 thicknesses are chosen than the location of the forbidden gap changes as given by Eq. (1).

Figure 2:
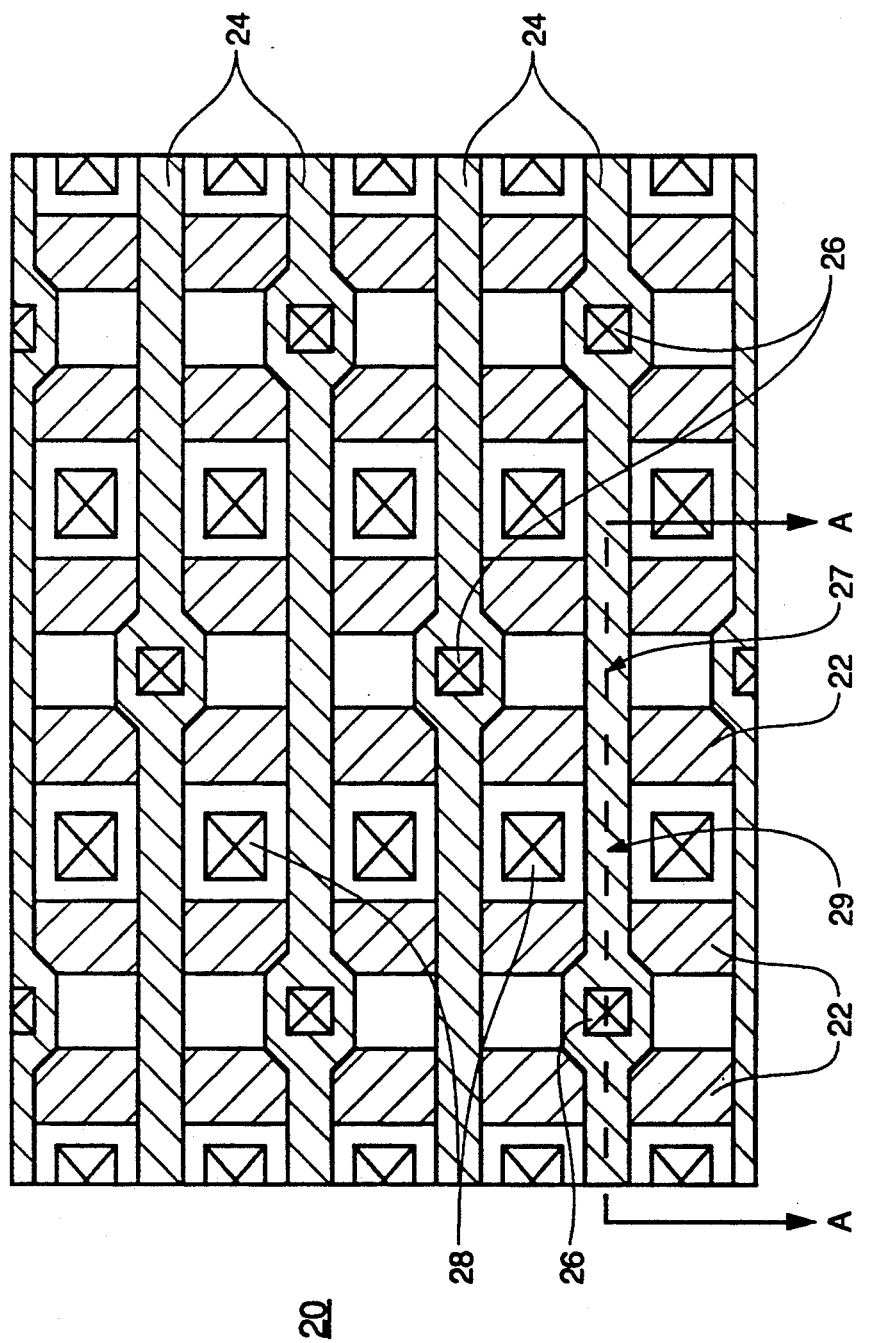
FIG. 2 is a top planar view of a portion of an in-process wafer showing digit-lines, word-lines and buried contacts.

Referring now to FIG. 2, there is shown a portion of a multi-layered memory array having a bulk silicon wafer 30 upon which has been deposited word-lines 22 and digit-lines 24. Also shown are a series of first buried contacts (BC1) 26 and a series of second buried contacts (BC2) 28. Also shown are the location of a gap 29 formed between second buried contacts (BC2) 28 and a gap 27 formed equidistant along the digit-line between first buried contacts (BC1) 26.

Figure 3:
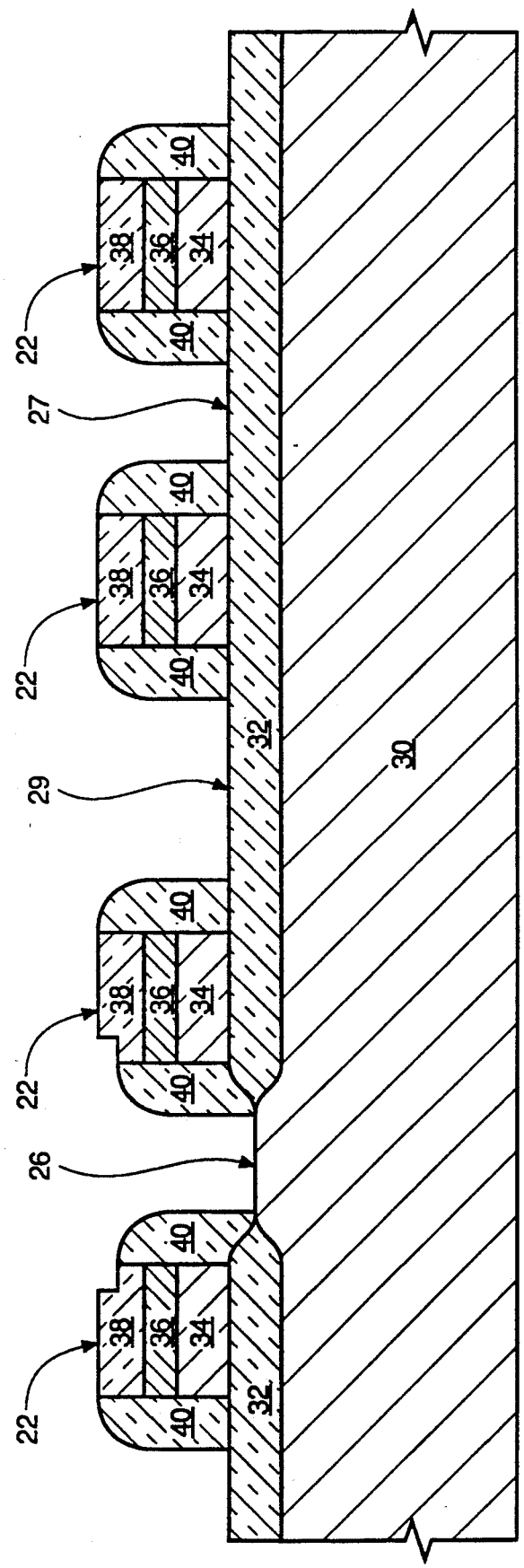
FIG. 3 is a cross sectional view through broken line A—A of FIG. 2 prior to deposition of Poly2.

Viewing a cross section taking along A—A of FIG. 2, and referring now to FIG. 3, word-lines 22 are formed after active area and field definitions upon the bulk silicon wafer 30. As shown, Poly1 34, covered with the silicide 36 and dielectric 38 (either oxide or nitride) are patterned to serve as word-lines 22. Word-lines 22 are further isolated from one another as well as subsequent conductive layers by dielectric Spacers40 (also either oxide or nitride) that have been formed over a thin layer of gate oxide (not shown) or a thick layer of field oxide 32. Dielectrics 38 and 40 may be deposited by chemical vapor deposition (CVD) which is preferred for its excellent conformity.

When the word-lines 22 are formed, the first buried contacts (BC1) 26 are defined and etched. As shown in the cross section of FIG. 3, 3 gaps are formed, each having dimensions dependent upon the Poly2 and Spacer1 thicknesses associated therewith. The first gap is formed by BC1 26 and in the present embodiment has a spacing or gap between word-lines of $0.97\mu$, a second gap 29 is formed between second buried contacts BC2 28 having a spacing or gap between word-lines or gap 22 of $1.46\mu$. A third gap 27 is formed between adjacent BC1 contacts and has a spacing or gap between word-lines of $0.73\mu$. These gaps result from choosing a Spacer1 thickness of $0.28\mu$ and a digit-line poly thickness of 2200Å so that no gaps lie in the critical gap region 14 shown on graph 10 of FIG. 1. Again, if different Spacer1 and digit-line poly thicknesses are selected then different word-line gaps will be required to avoid the critical gap region and achieve a bridge-gap digit-line.

Figure 4:
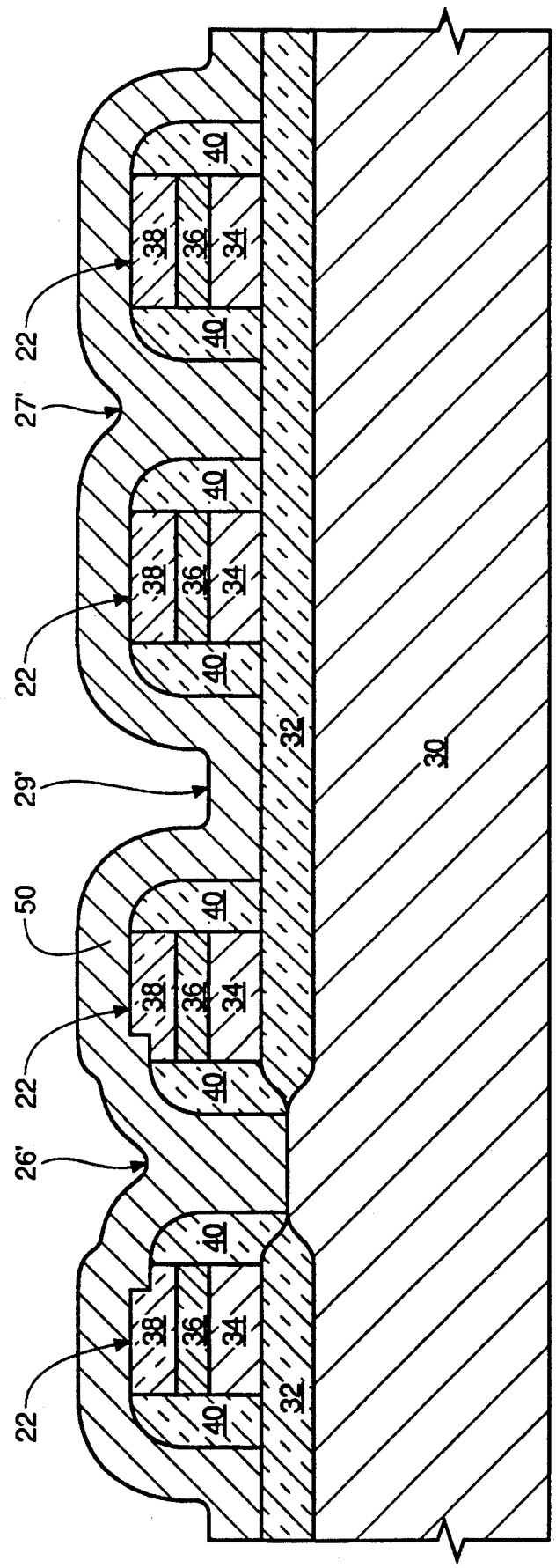
FIG. 4 is the cross sectional view of FIG. 3 with Poly2 deposited.

Referring now to FIG. 4, Poly2 is deposited with a predetermined thickness so that first buried contact 26 and first buried contact gap 27 are bridged by the Poly2 deposition as shown at 26' and 27' respectfully. The BC2 gap 29 is wide enough so that the Poly2 flows between the word-lines following the contour of the gap to a depth indicated at 29'. The thickness of Poly2 is chosen, and referring again to FIG. 1, such that the bridges at points 26' and 27' and the depth at which it follows the gap contour 29' avoid the critical gap region 14 shown in graph 10.

Figure 5:
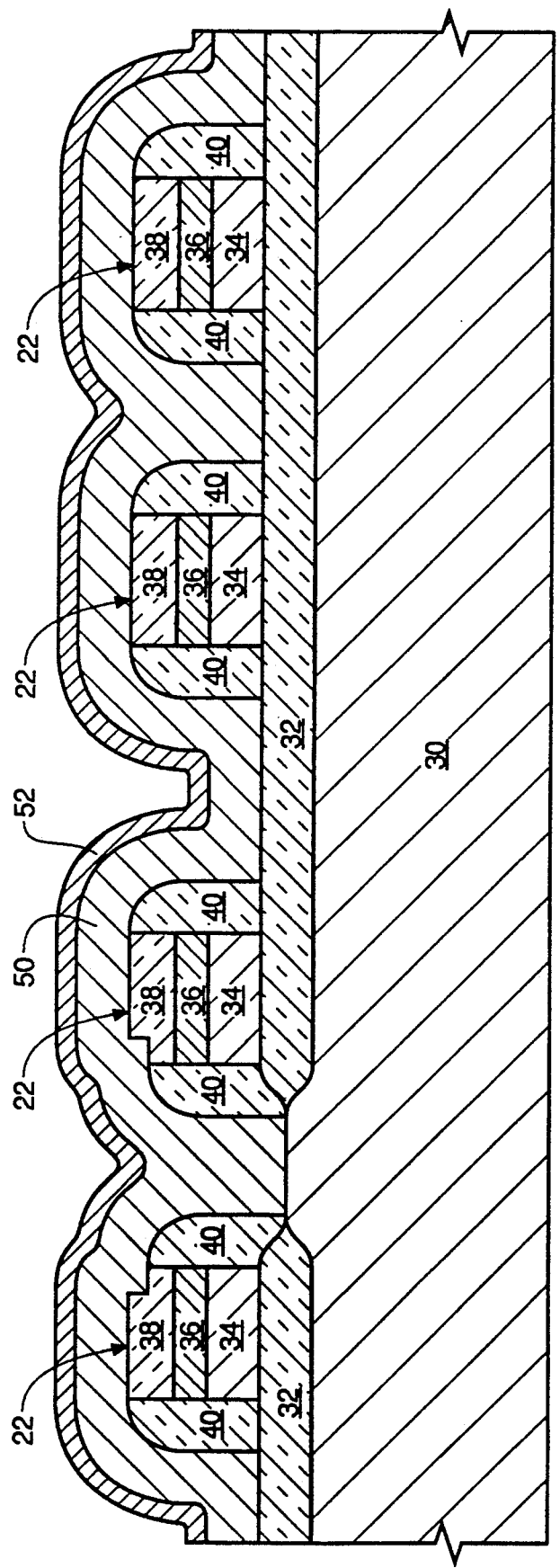
FIG. 5 is a cross sectional view of FIG. 4 after the deposition of the digit-line refractory silicide layer.

Referring now to FIG. 5, a silicide layer 52 is deposited. The deposition 52 bridges across the first buried contact (BC1) at 26' and the first buried contact gap 27' due to Poly2 filling. As the bridging Poly2 positions the silicide deposition 52 along line 12 and below the critical gap region 14 of graph 10, the digit-line resistance is reduced.

At the second buried contact (BC2) gap at 29', the silicide layer does not bridge the gap point 29', but rather follows the Poly2 deposition between the word-lines 22. The Poly2 thickness is chosen so that the word-line gap at 29' has a gap width again positioned in the low digit-line resistance region but along line 16 of graph 10.

In an alternate embodiment, a Poly2 etch-back sequence can also be incorporated into this Bridge Gap method. In this process, the Poly2 is deposited slightly thicker than above, along the order of 2,700Å thick, by way of example. The undoped Poly2 is then etched back to approximately 1,400Å thickness, the Poly2 is doped and silicide is deposited as above. This results in a Bridge Gap digit-line that has improved process margins. Further, it allows a larger CD variation in the word-line gaps while still maintaining low digit-line resistance. Also, the process may be enhanced by using an isotropic etch-back on the Poly2 to widen the buried contact 2 (BC2) Poly gap shown at 29', prior to the silicide deposition.

Figure 6:
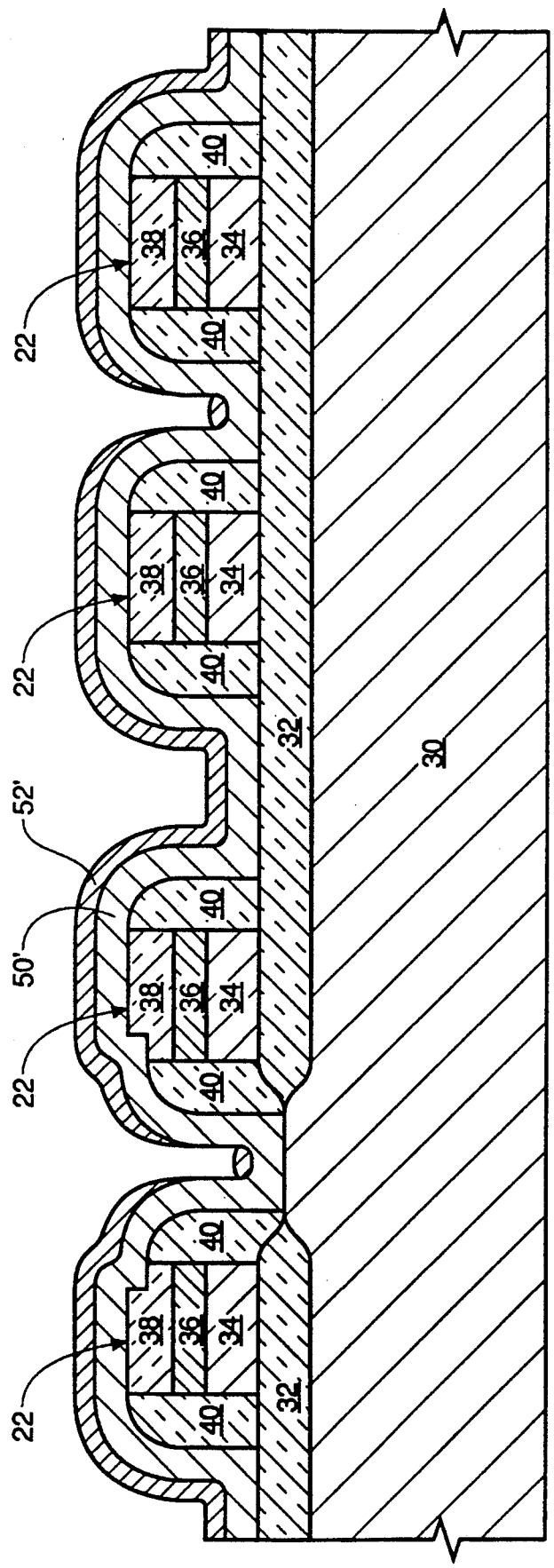
FIG. 6 is the cross sectional view of FIG. 5 where the Poly2 coating deposited in FIG. 4 is less than a predetermined optimum thickness with the result that there exist regions along the BC1 contact sidewall and the BC1' gap sidewall where there is no refractory silicide deposited.

In the above described process, care must be taken that the Poly2 thickness is deposited at the thickness determined by equation (1). If, and referring now to FIG. 6, the Poly2 thickness is too thin, it may be seen that the first buried contact (BC1) and the first buried contact gap are not bridged, and when the silicide layer is deposited the gap width will be within the critical gap width 14 shown in graph 10, with the indicated rise in digit-line resistance.

Figure 7:
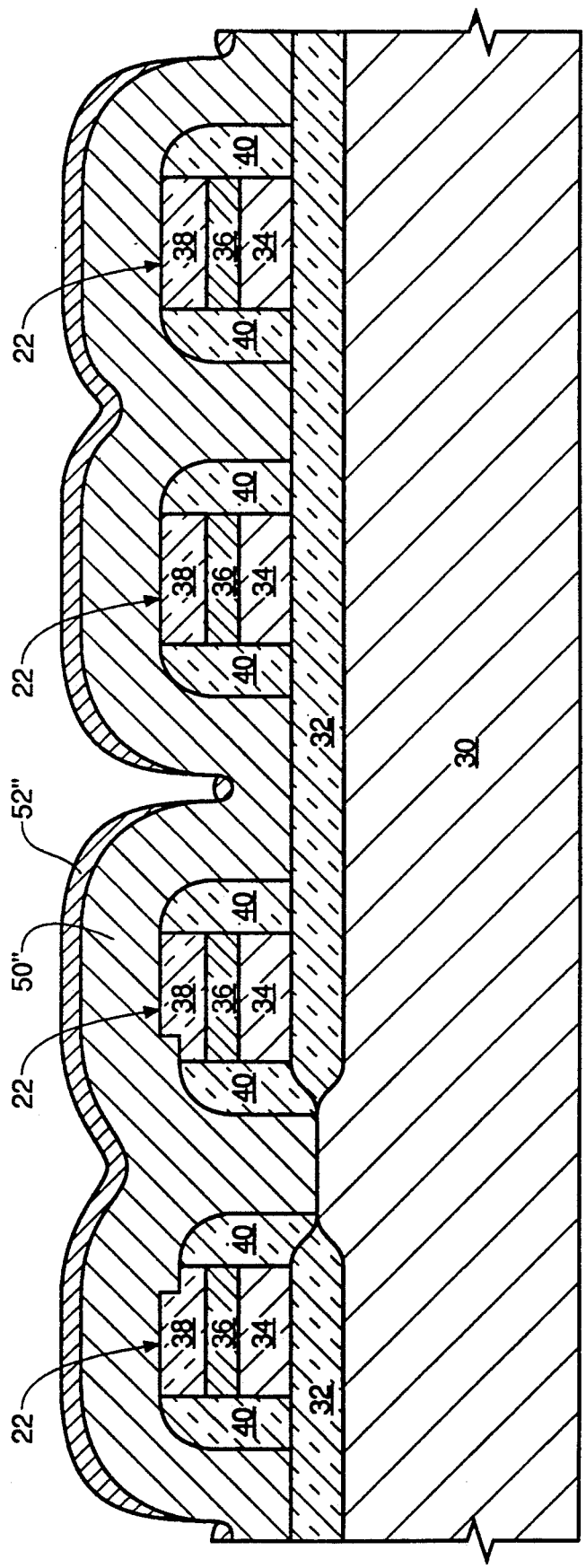
FIG. 7 is the cross sectional view of FIG. 5 where the Poly2 coating deposited in FIG. 4 is greater than a predetermined optimum thickness with the result that there exist regions along the BC2 gap sidewall where there is no refractory silicide deposited.

Conversely, if the Poly2 is deposited too thick, as shown in FIG. 7, then the second buried contact gap will be such that deposition of the silicide will place the gap width into the critical gap region of graph 10, with the attendant rise in the digit-line resistance.

Throughout the above described embodiments, Polysilicon is deposited and conductively doped to serve as conductive lines. However, materials that possess conductive qualities and which can be deposited or sputtered may be used in place of Polysilicon if so desired. Also, in the above-described embodiments, a refractory silicide ($WSi_x$) is deposited to serve as a conductive line. However, many refractory silicides such as $MoSi_x$, $TaSi_x$ or $TiSi_x$ could be deposited or sputtered or refractory metals such as W, Mo, Ta, or Ti could be deposited and used in place of $WSi_x$. It is therefore to be understood that although the present invention has been described with reference to a preferred embodiment, various modifications, known to those skilled in the art may be made to the structures and process steps presented herein without departing from the invention as recited in the several claims appended hereto.

We claim:

1. A method of forming digit lines on a semiconductor wafer having integrated circuits, comprising the steps of:
   selectively processing the wafer by depositing and patterning different conductive and insulating layers to produce word lines and active areas;
   defining gaps in the conductive and insulating layers;
   determining a range of critical dimensions related to said gaps as a function of digit line resistance;
   dimensioning said gaps to provide a first group of said gaps to have dimensions less than the smallest dimension in said range of critical dimensions and a second group of said gaps to have dimensions greater than the largest dimension in said range of critical dimensions;
   providing a layer of doped polysilicon having a selected thickness atop said word lines and active areas, including the steps of bridging said first group of gaps and following the topology of said second group of gaps with said doped polysilicon layer;
   providing a layer of electrically conductive material atop the doped silicon layer; and
   removing portions of both the doped polysilicon layer and the electrically conductive material layer to form digit lines.

2. The method of forming digit lines of claim 1 wherein said gaps are defined in relation to said word lines and said active areas.

3. The method of forming digit lines of claim 1 including forming dielectric spacers in both groups of said gaps.

4. The method of forming digit lines of claim 1 including the step of isotropically etching said doped polysilicon layer.

5. The method of forming digit lines of claim 4 including anisotropically etching said spacers.

6. The method of forming digit lines of claim 1 wherein said dimensioning said first and second group of gaps comprises providing spacers in said gaps and etching same for providing gap dimensions outside of the range of critical dimensions.

7. The method of forming digit lines of claim 6 including forming dielectric spacers comprising silicon oxide.

8. The method of forming digit lines of claim 6 including etching dielectric spacers formed in the first group of said gaps for providing gap dimensions less than the smallest dimension in said range of critical dimensions and etching dielectric spacers formed in the second group of said gaps for providing gap dimensions greater than the largest dimension in said range of critical dimensions.

9. The method of forming digit lines of claim 6 including forming dielectric spacers comprising silicon nitride.

10. The method of forming digit lines of claim 9 wherein said etching is anisotropic.

11. The method of forming digit lines of claim 6 including anisotropically etching said dielectric spacers.

12. The method of forming digit lines of claim including the step of isotropically etching said doped polysilicon layer.

13. The method of forming digit lines of claim 1 wherein said step of bridging said first group of gaps comprises providing said layer of doped polysilicon in a selected thickness, said selected thickness sufficient to fill said gaps included in said first group.

14. The method of forming digit lines of claim 13 wherein said selected thickness of said layer of doped polysilicon follows the topology of said gaps included in said second group.

15. The method of forming digit lines of claim 14 including the step of isotropically etching said doped polysilicon layer.

16. The method of forming digit lines of claim 13 including the step of isotropically etching said doped polysilicon layer.

17. The method of forming digit lines of claim 16 including providing a layer of electrically conductive material atop the layer of doped polysilicon and etching the layer of doped polysilicon and the layer of electrically conductive material to form the desired pattern of digit lines.

18. The method of forming digit lines of claim 17 including the step of etching said layer of doped silicon prior to providing said layer of electrically conductive material.

19. The method of forming digit lines of claim 17 wherein said electrically conductive material is a refractory silicide selected from the group comprising $WSi_x$, $MoSi_x$, TaSi and $TiSi_x$.

20. The method of forming digit lines of claim 18 wherein said electrically conductive material is a refractory metal selected from the group comprising W, Mo, Ta and Ti.

21. A method of forming digit lines within a semiconductor memory on a semiconductor wafer having integrated circuits, comprising the steps of:

selectively processing the wafer by depositing and patterning different conductive and insulating layers to produce word lines and active areas which define gaps in the conductive and insulating layers;

determining a range of critical dimensions indicative of resistance versus gap width and including a lower and an upper value;

dimensioning said gaps to have dimensions situated outside the range of critical dimensions;

providing a layer of doped polysilicon atop the word lines and active areas, the layer having a thickness selected to bridge the gaps having a dimension less than the lower value of the range of critical dimensions and to follow the topology of the gaps having a dimension greater than the upper value of the range of critical dimensions;

providing a layer of electrically conductive material atop the layer of doped polysilicon; and removing portions of both the layer of doped polysilicon and the layer of electrically conductive material to form digit lines.

22. The method of claim 21 including selecting the electrically conductive material from a group of refractory silicides including $WSi_x$, $MoSi_x$, TaSi and $TiSi_x$.

23. The method of claim 21 including selecting the electrically conductive material from a group of refractory metals including W, Mo, Ta and Ti.

24. The method of claim 23 including the step of removing portions of the layer of doped polysilicon prior to providing the layer of refractory metal.

* * * * *

UNITED STATES PATENT AND TRADEMARK OFFICE
CERTIFICATE OF CORRECTION

PATENT NO. : 5,084,406
DATED : January 28, 1992
INVENTOR(S) : Rhodes et al.

It is certified that error appears in the above-indentified patent and that said Letters Patent is hereby corrected as shown below:

Column 1, line 36, delete "SiOz" and insert -- $SiO_2$ --.

Column 6, line 40, after "claim", kindly insert -- 11 --.

Column 8, line 15, delete "TaSi" and insert -- $TaSi_x$ --.

Signed and Sealed this

Fourteenth Day of December, 1993

Attest:

BRUCE LEHMAN

Attesting Officer   Commissioner of Patents and Trademarks